United States Patent [19]

Comstedt et al.

[11] 4,333,118

[45] Jun. 1, 1982

[54] LOAD INDICATORS FOR ALTERNATING-CURRENT MOTORS

[75] Inventors: Per A. P. Comstedt, Löddeköpinge; Bo A. Elfner, Lund, both of Sweden

[73] Assignee: El-Fi Innovationer AB, Helsingborg, Sweden

[21] Appl. No.: 228,553

[22] Filed: Jan. 26, 1981

[30] Foreign Application Priority Data

Jan. 29, 1980 [SE] Sweden .............................. 8000672

[51] Int. Cl.³ ...................... H02H 7/085; H02H 3/42
[52] U.S. Cl. ......................................... 361/30; 361/23; 361/79; 340/648; 324/142
[58] Field of Search ....................... 361/30, 23, 79, 86, 361/87, 28, 31, 82, 80; 340/648, 660, 664; 324/142

[56] References Cited

U.S. PATENT DOCUMENTS

| | | | |
|---|---|---|---|
| 3,579,217 | 5/1971 | Casey et al. ...................... | 361/30 X |
| 3,931,559 | 1/1976 | McKee ............................. | 361/79 X |
| 4,079,313 | 3/1978 | Callan ................................ | 324/142 |
| 4,100,587 | 7/1978 | Anderson et al. .................... | 361/82 |

*Primary Examiner*—Patrick R. Salce
*Attorney, Agent, or Firm*—Cushman, Darby & Cushman

[57] ABSTRACT

A load indicator for A.C. motors has an analog multiplying circuit for producing a signal proportional to the product of the current of the A.C. motor and the voltage thereof. From this signal a signal is substracted which is proportional to the absolute value of the motor current. The average value of the differential signal is a measure of the load of the motor which is substantially independent of variations in the motor voltage, provided the proportionality constants are chosen in a suitable manner.

5 Claims, 7 Drawing Figures

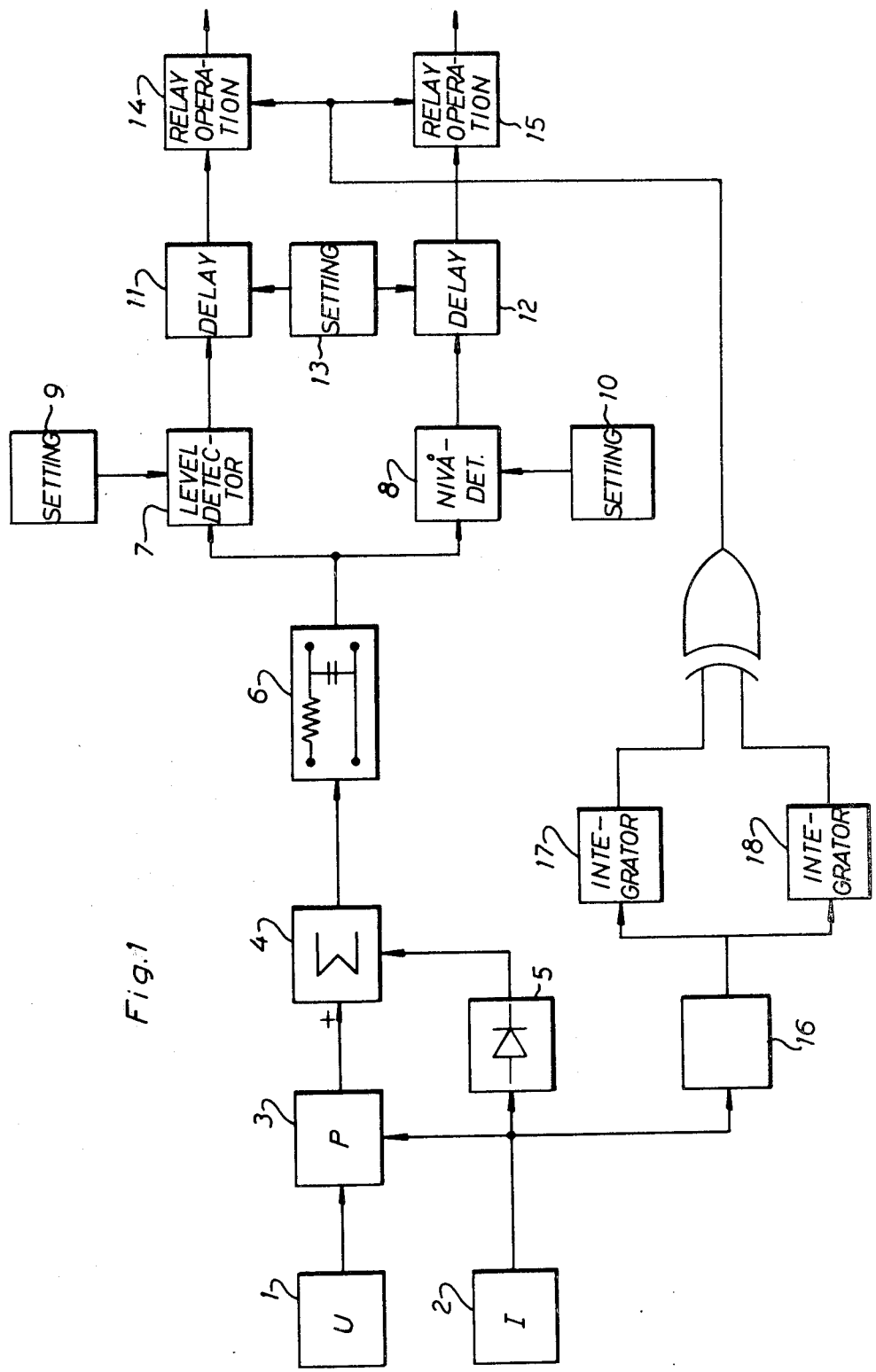

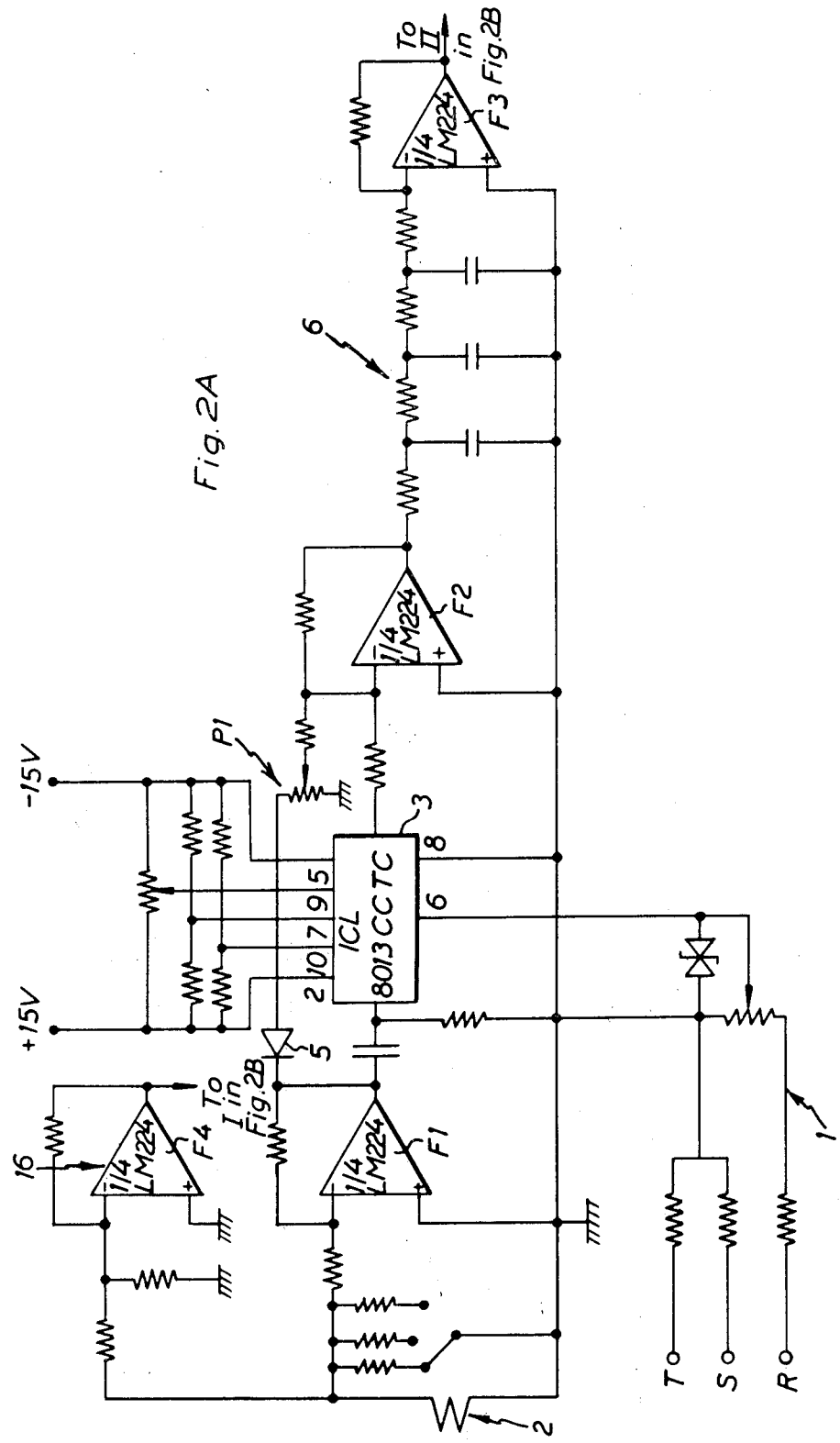

LOAD INDICATORS FOR ALTERNATING-CURRENT MOTORS

This invention relates to a load indicator for alternating-current motors.

There are previously known indicators which base their load determination on the motor current, the motor output or the phase difference between the motor voltage and the motor current. Each of these types suffer from disadvantages because of e.g. low sensitivity at certain loads or their voltage dependency.

The object of the present invention is to provide a load indicator which bases its load determination primarily on the power supplied to the motor but substantially reduces the possibility of an erroneous determination owing to variations in the power supplied as the voltage applied to the motor varies.

This object is realized in that the load indicator includes a transmitter for producing a signal representing the motor current and a transmitter for producing a signal representing the motor voltage, said indicator comprising a multiplying circuit for multiplying the signals representing the motor current and the motor voltage by each other to produce a signal representing the power supplied a circuit for producing a signal representing the absolute value of the motor current, a differential circuit for providing a signal which represents the difference between the signal representing the power supplied and the signal representing the absolute value of the motor current, and a circuit for selecting the relative sizes of the input signals of the different circuit in dependence on the A.C. motor connected.

Further features characteristic of the invention will appear from the appendant claims.

The invention thus makes use of the established fact that the motor load is substantially proportional to the difference between the power P supplied to the motor and the magnitude $k|I|$, where I is the motor current and k is an empirically determinable constant. By this correction of the power there is thus obtained a measure of the motor load within the normal loading capacity of the motor, which is substantially independent of voltage variations normally occurring on power distribution mains. More particularly, said measure is useful for voltage variations of $-15\%$ to $+10\%$ and up to 2 to 3 times the normal load.

A load monitor which makes use of the invention shall be described in greater detail below with reference to the accompanying drawings in which:

FIG. 1 is a block diagram of the load monitor;

FIGS. 2A and 2B are a wiring diagram of the preferred embodiment of the load monitor.

Figure 2B:
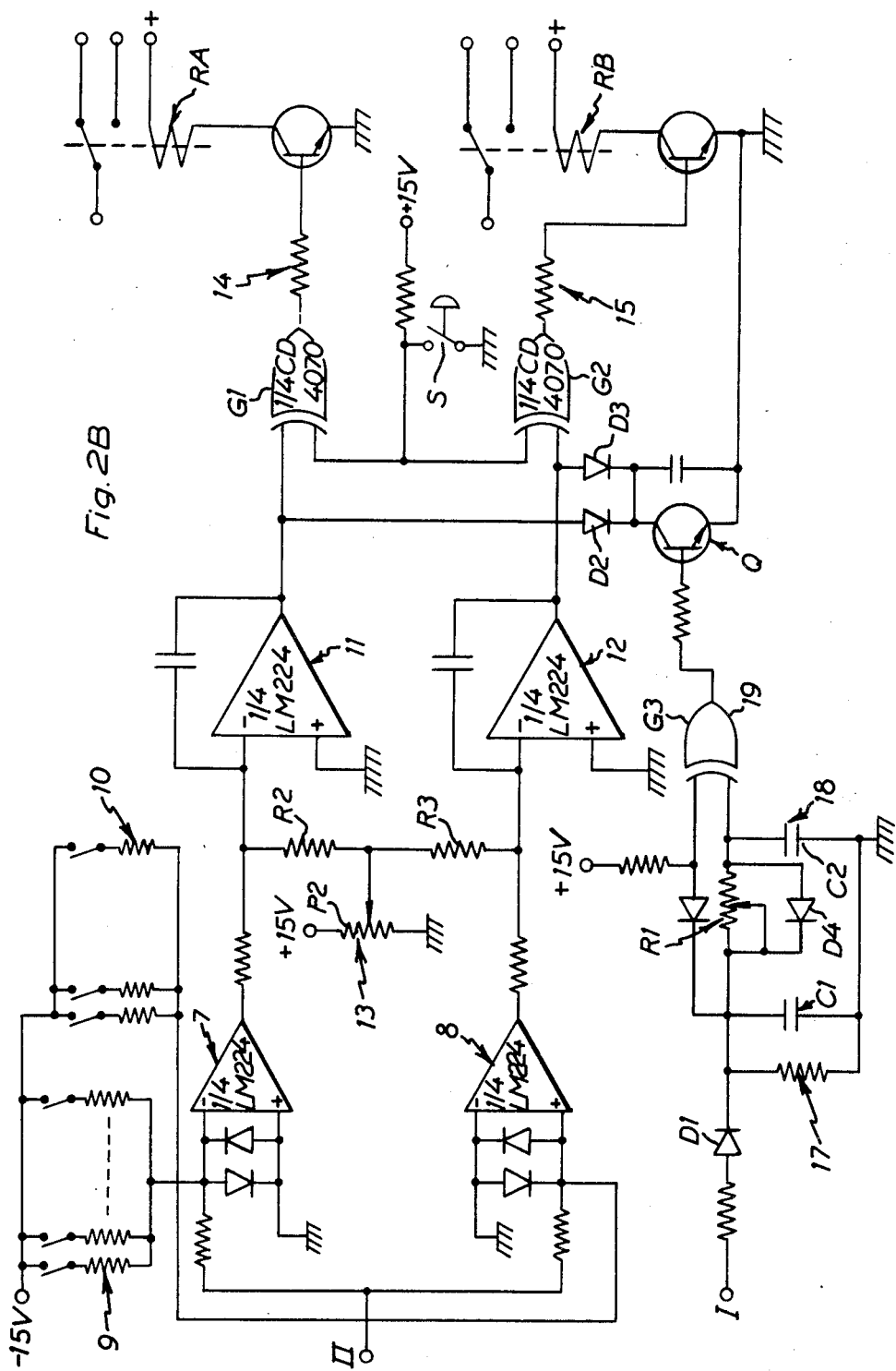

The load monitor diagrammatically shown in FIG. 1 includes voltage and current transmitters 1 and 2 which deliver signals representing the motor voltage and motor current, respectively, of an A.C. motor (not shown). These signals are supplied to a multiplying circuit 3 for producing a signal representing the power supplied to the motor. A differential circuit 4 provides the difference between the signal representing the power supplied and a signal proportional to the absolute value of the motor current, which latter signal is produced with variable proportionally constant by a rectifier 5. The output signal of the differential circuit is smoothed in a filter 6 and supplied to two level detectors 7 and 8 the switching level of which can be set by means of separate setting circuits 9 and 10. Each of the level detectors 7 and 8 is connected to a delaying unit 11 and 12, respectively, having a common setting circuit 13 for the size of the delay. Each of the delaying units 11, 12 is connected to a relay operator 14 and 15, respectively, for actuation of a maximum load relay and a minimum load relay, respectively, (not shown). The motor current transmitter 20 delivers via a current detector 16 a signal to two integrators 17 and 18 of different integration constants. The outputs of said integrators are connected to an EXCLUSIVE-OR gate 19 the output of which is connected to the relay operators 14 and 15 for disabling them for a period of time at the starting of the motor.

Figure 3A:
FIGS. 3A-3D shows curve shapes for the signals at some points of the circuitry according to FIG. 2A.
Figure 3B:
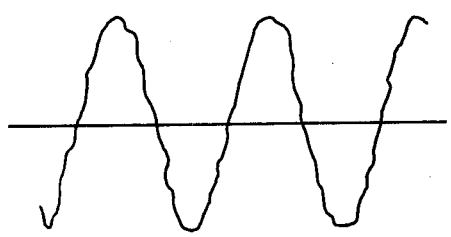
Figure 3C:
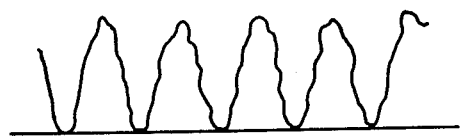
Figure 3D:

The preferred embodiment of the load monitor diagrammatically illustrated in FIG. 1 is shown in FIGS. 2A-2B. As will appear from this Figure the voltage transmitter 1 comprises a circuitry of resistors via which a signal representing the motor voltage (cf. FIG. 3A) is supplied to the multiplying circuit 3 which has the form of an integrated circuit of the type ICL8013CCTC. The current transmitter 2 is in the form of a current transformer the secondary winding of which is shown in FIG. 2A connected across the inputs of an amplifier F1 parallel with a resistance network for adaptation of the input signal level to the amplifier F1. The output of the amplifier F1 is connected to an input of the multiplying circuit 3 the output of which is connected to an input of an amplifier F2, the output of which is connected to an input of a buffer amplifier F3 via a smoothing circuit 6 comprising resistors and capacitors. Connected to the output of the amplifier F1 is one terminal of a rectifier 5 having the form of a diode. The other terminal of the diode is connected to a potentiometer P1 and a signal proportional to the motor current is supplied from the movable tap of the potentiometer P1 to the input of the amplifier F2 during every second semi-cycle. The signal (shown in FIG. 3D) at the output of the amplifier F2 thus is proportional during every second semi-cycle to the difference $P-K|I|$ and otherwise proportional to P. The output of the amplifier F3 is connected to two level detectors 7 and 8 in the form of operational amplifiers, the switching level of the detectors being settable by means of separate resistance networks 9 and 10. The outputs of the level detectors 7 and 8 are each connected to the input of an integrator 11 and 12, respectively, formed by an operational amplifier. The outputs of the integrators 11 and 12 are each connected to an EXCLUSIVE-OR gate G1 and G2, respectively, which have each of their outputs connected to a relay RA and RB, respectively, having a make-and-break contact. The voltage produced in the secondary winding of the current transformer 2 is amplified by a heavily overmodulated operational amplifier F4 which thus delivers a signal with one of two levels in response to the motor being supplied with current or not. Said signal is supplied via a diode D1 to a first capacitor C1 for charging the same. A second capacitor C2 is in series with a settable resistor R1 which is connected in parallel with the first capacitor. The voltages across the two capacitors C1, C2 are applied to an EXCLUSIVE-OR gate G3, the output signal of which controls a transistor Q, the collector-emitter path thereof being connected between earth and two diodes D2 and D3 each of which is connected to one of the outputs of the integrators 11 and 12. Alternatively, zero voltage or a positive voltage can be applied, by actuation of a switch S, to the other inputs of the EXCLUSIVE-OR gates G1 and G2 which control the relays RA and RB.

The load monitor described above briefly functions as follows.

The secondary winding of the current transformer 2 supplies to the multiplying circuit 3 a signal (see FIG. 3B) representing the motor current. The circuitry 1 formed by resistors supplies to the multiplying circuit 3 a signal (see FIG. 3A) representing the motor voltage. The multiplying circuit 3 delivers to the amplifier F2 a signal (see FIG. 3C) representing the power supplied to the motor, and the amplifier F2 delivers at its output a signal (see FIG. 3D) representing the difference between the power supplied to the motor and a magnitude which is zero during every second semi-cycle of the motor current and otherwise proportional to the absolute value of the motor current. The smoothing filter 6 between the amplifiers F2 and F3 provides a D.C. signal at the output of the amplifier F3. The level of said signal is substantially proportional to the size of the motor load and is compared by the level detectors 7 and 8 with maximum and minimum levels set for the size of the motor load. As long as the signal level at the output of the amplifier F3 lies between the maximum and minimum levels set, the voltage at the outputs of the integrators 11 and 12 will be −15 V and no change of the condition of the relays RA and RB will take place. When the signal level at the output of the amplifier F3 exceeds the maximum load level set, the output of the upper level detector 7 will change from positive to negative potential, the next following integrator 11 commencing an integration during which the potential at the output of the integrator increases from −15 V to +7,5 V, which latter potential is the switching point of the next following EXCLUSIVE-OR gate G1. The corresponding procedure will occur when the output signal level of the amplifier F3 is lower than a preset minimum load level. The integration time constant can be influenced, for instance in the range of 50 ms up to 4 s, by means of a potentiometer P2 common to the two integrators 11 and 12, the movable tap of said potentiometer being connected via resistors R2 and R3 to the respective input of the integrators 11, 12.

The time circuits connected to the outputs of the amplifier F4 and having different time constants, will prevent the load monitor from functioning for a short period of time after the start of the motor, so as to render an unintentional release of the monitor impossible. By connecting a diode D4 in the illustrated manner across the resistor R1 the load monitor is also prevented from functioning at disconnection of the motor.

Several modifications of the embodiment illustrated in FIGS. 2A and 2B are conceivable within the scope of the invention. For instance, a full wave rectifier could be utilized instead of the half-wave rectifying diode 5. With regard to the embodiment according to FIGS. 2A and 2B the value of k will in that case be half as large since the signal representing the absolute value of the current now is not zero for every second half-cycle.

The present invention thus provides a load monitor for A.C. motors including the load indicator according to the invention which is almost entirely independent of variations in the motor voltage, provided that the proportionality constant is chosen in a suitable way. The determination of the value of said constant k must be made empirically. The value which usually lies in the interval 0–5, is primarily dependent upon the motor size and secondarily on the motor type.

The load indicator according to the invention can be generally utilized for controlling or influencing cycles in dependence on the load of an A.C. motor. Thus the signal obtained from the filter 6 can be converted into an analog output signal in say the range 0–20 mA. Generally, the invention includes the functions brought about by the blocks 1–6 in FIG. 1 and the corresponding circuits in FIG. 2.

We claim:

1. A load indicator for A.C. motors comprising a transmitter (2) for producing a signal representing the motor current, a transmitter (1) for producing a signal representing the motor voltage, a multiplying circuit (3) for multiplying the signals representing the motor current and the motor voltage by each other for producing a signal representing the power supplied, a circuit (5) for producing a signal representing the absolute value of the motor current, a differential circuit (4) for providing a signal representing the difference between the signal representing the power supplied and the signal representing the absolute value of the motor current, and a circuit (P1) for selecting the relative sizes of the input signals of the differential circuit in dependence on the A.C. motor connected.

2. A load indicator as claimed in claim 1, wherein the circuit (5) for producing a signal representing the absolute value of the motor current includes a rectifier connected to the transmitter (2) for producing a signal representing the motor current.

3. A load indicator as claimed in claim 2, wherein the rectifier (5) is a half-wave rectifier.

4. A load indicator as claimed in claim 2, wherein the circuit (P1) for selection of the relative sizes of the input signals of the differential circuit (4) comprises a voltage divider (P1) connected to the output of the rectifier (5) for setting the value of a constant k in the signal $P-k|I|$ formed by the differential circuit (4), wherein P is the output signal of the multiplying circuit (3) and I is the output signal of the current transmitter (2).

5. A load indicator as claimed in any of claims 1–4, comprising a detector circuit (6, 7, 8) for detecting when the average value of the differential signal exceeds or is lower than the preset levels, corresponding to a predetermined maximum and minimum load, respectively.

* * * * *